United States Patent
Krasulick et al.

(10) Patent No.: US 7,120,183 B2
(45) Date of Patent: Oct. 10, 2006

(54) ELECTRO-ABSORPTION MODULATED LASER WITH HIGH OPERATING TEMPERATURE TOLERANCE

(75) Inventors: Stephen B. Krasulick, Fogelsville, PA (US); Terence D. Grenda, Perkasie, PA (US); Paul Kit Lai Yu, San Diego, CA (US)

(73) Assignee: Optium Corporation, Chalfont, PA (US)

( * ) Notice: Subject to any disclaimer, the term of this patent is extended or adjusted under 35 U.S.C. 154(b) by 502 days.

(21) Appl. No.: 10/005,065

(22) Filed: Dec. 4, 2001

(65) Prior Publication Data
US 2003/0012244 A1  Jan. 16, 2003

Related U.S. Application Data

(60) Provisional application No. 60/304,496, filed on Jul. 11, 2001.

(51) Int. Cl.
*H01S 5/00* (2006.01)
(52) U.S. Cl. .................. 372/50.1; 372/26; 359/245
(58) Field of Classification Search ........... 372/43–50, 372/25, 26; 359/245
See application file for complete search history.

(56) References Cited

U.S. PATENT DOCUMENTS

| | | | |
|---|---|---|---|
| 4,993,032 A | 2/1991 | Bradley | 372/20 |
| 5,043,991 A | 8/1991 | Bradley | 372/32 |
| 5,402,259 A | 3/1995 | Lembo et al. | 359/245 |
| 5,742,423 A | 4/1998 | Ido et al. | |
| 5,760,939 A | 6/1998 | Nagarajan et al. | |
| 5,771,257 A | 6/1998 | Takiguchi et al. | 372/50 |
| 5,825,525 A * | 10/1998 | Harwit | 359/248 |
| 5,926,493 A | 7/1999 | O'Brien et al. | 372/45 |
| 5,933,265 A | 8/1999 | Nagarajan | |
| 6,014,392 A | 1/2000 | Imai et al. | |
| 6,134,368 A * | 10/2000 | Sakata | 385/131 |
| 6,150,667 A | 11/2000 | Ishizaka et al. | 257/21 |
| 6,320,688 B1 * | 11/2001 | Westbrook et al. | 398/194 |
| 6,835,585 B1 * | 12/2004 | Kim | 438/47 |
| 2001/0026570 A1 | 10/2001 | Hisanaga et al. | |
| 2002/0118713 A1 | 8/2002 | Shirai et al. | |

FOREIGN PATENT DOCUMENTS

| | | |
|---|---|---|
| EP | 0 558 089 A2 | 9/1993 |
| JP | 2002261377 A | 2/2001 |
| JP | 2003017798 A | 1/2003 |

OTHER PUBLICATIONS

Sakaino, G., et al., "Transmission Characteristics of Uncooled and Directly Modulated 1.3 micrometers Distributed Feedback Laser Diode for Serial 10Giga bit Ethernet", IEEE 2000, no month.

(Continued)

*Primary Examiner*—James Menefee
(74) *Attorney, Agent, or Firm*—Kurt Rauschenbach; Rauschenbach Patent Law Group, LLC (57) ABSTRACT

An electra-absorption modulator and electra-absorption modulated laser are described that include a semiconductor layer having an electrically controllable absorption. The material composition of the semiconductor layer is chosen so that the semiconductor layer is substantially transparent to light propagating through the semiconductor layer when a substantially zero or a reverse bias voltage is applied across the semiconductor layer at operating temperatures of the electro-absorption modulator that are substantially greater than 25 degrees Celsius.

33 Claims, 8 Drawing Sheets

OTHER PUBLICATIONS

Clesca B. et al, 3.2 NM Wavelength Tuning Via Temperature Control For Integrated Electroabsorption modulator/DBF Laser With High Tolerance To Chromatic Dispersion, Electronics Letters, IEE Stevenage, May 9, 1996, pp. 927-929, vol. 32, No. 10, GB.

Goto et al, Design And Performance Of A 10-Gbit/s Optical Transmitter Module, Proceedings Of The Electronic Components And Technology Conference, May 18-20, 1992, pp. 830-837, vol. Conf. 42, IEEE, New York.

Hideaki Tanaka et al, Temperature Dependence of InGaAsP Electro-Absorption Modulator Module, Proceedings Of The International Conference On Indium Phosphide Arid Related Materials, May 9-13, 1995, pp. 540-543, vol.Conf. 7, IEEE New York.

Hou H.Q. et al, Demonstration of Wide-Temperature-Range Electroabsorption Modulation Near 1.5 um Using Coupled Quantum Wells, Semiconductor Science and Technology, Oct. 1, 1996, pp. 1429-1433, vol. 11, No. 10, Institute of Physics, London.

Clesca, 3.2nm Wavelength Tuning Via Temperature Control For Integrated Electroabsorption Modulator/DFB Laser With High Tolerence To Chromatic Dispersion, Electronics Letters, May 9, 1996, pp. 927-928, vol. 32, No. 10.

Clesca, 2.5-Gbit/s, 1291-km Transmission Over Non-Dispersion-Shifted Fibre Using An Integrated Electroabsorption Modulator/ DFB Laser Module, Proc. 21st Eur. Conf. on Opt.Comm., 1995, pp. 995-996, Brussels, Belgium.

* cited by examiner

ELECTRO-ABSORPTION MODULATED LASER WITH HIGH OPERATING TEMPERATURE TOLERANCE

RELATED APPLICATIONS

This patent application claims priority to provisional patent application Ser. No. 60/304,496, filed on Jul. 11, 2001, the entire disclosure of which is incorporated herein by reference.

FIELD OF THE INVENTION

The present invention relates generally to optical modulators and to modulated lasers. In particular, the present invention relates to methods and apparatus for modulating light with an electro-absorption modulator.

BACKGROUND OF THE INVENTION

Electro-absorption modulators (EAMs) and electro-absorption modulated lasers (EMLs) are useful for transmitting information in telecommunications or data communication systems. EMLs have several advantages over other modulation sources. For example, EMLs can directly generate communication signals with relatively low bit-error rates without the use of external filters, which are undesirable because they are relatively large and expensive. External filters also occupy valuable space on the transmitter electronics board. In addition, EMLs directly generate transmission characteristics that have a relatively "clean" eye pattern when viewed on a communication signal analyzer. Such an eye pattern indicates acceptable discrimination between a digital "1" and digital "0" and, therefore, a relatively error-free (i.e. a bit error rate of less than $10^{-9}$) information transmission.

Another advantage of EMLs is that they can generate a stable and high-power modulated light beam. Yet another advantage of EMLs is that they can generate optical signals that are modulated at relatively high data rates. In addition, an EML is convenient to use because it is relatively easy to mount an EML in a package with an industry standard input impedance, which can be impedance matched to numerous commercially available drive voltage sources. EMLs are also relatively inexpensive.

A disadvantage of common, currently available EMLs, however, is that they require external thermal controllers for many practical applications. For example, EMLs require external thermal controllers, such as thermoelectric coolers (TECs), to maintain the EMLs at a substantially constant operating temperature so that data transmission can occur relatively error-free even as ambient temperatures vary over a relatively large range, e.g., over the entire Synchronous Optical Network (SONET) standardized operating temperature range. In general, external thermoelectric coolers are undesirable because they are power-intensive, relatively large and relatively expensive devices.

SUMMARY OF THE INVENTION

The present invention relates to electro-absorption modulators (EAMs) and electro-absorption modulated lasers (EMLs) with high operating temperature tolerance. An EAM and EML according to the present invention can operate without external thermal controllers, such as TECs, and thus can require less power and less space than known EAMs and EMLs. However, the methods and apparatus of the present invention can be practiced with or without external temperature control.

Accordingly, the present invention features an EAM that includes a semiconductor layer having an electrically controllable light absorption. In one embodiment, the semiconductor layer is a multi-quantum well layer. In another embodiment, the semiconductor layer is a bulk semiconductor layer. The material composition of the semiconductor layer is chosen so that the semiconductor layer is substantially transparent to light propagating through the semiconductor layer when a substantially zero or a reverse bias voltage is applied across the semiconductor layer at operating temperatures of the electro-absorption modulator that are substantially greater than 25 degrees Celsius. The material composition of the semiconductor layer may be chosen to modulate light that is substantially 1310 nm or that is substantially 1550 nm.

In another embodiment, the material composition is chosen so that the semiconductor layer is substantially transparent to light propagating through the semiconductor layer when a substantially zero or a reverse bias voltage is applied across the semiconductor layer at operating temperatures of the electro-absorption modulator that are substantially greater than 35 degrees Celsius. In another embodiment, the material composition is chosen so that the semiconductor layer is substantially transparent to light propagating through the semiconductor layer when a substantially zero or a reverse bias voltage is applied across the semiconductor layer at operating temperatures of the electro-absorption modulator that are substantially greater than 45 degrees Celsius.

In yet another embodiment, the material composition is chosen so that the semiconductor layer is substantially transparent to light propagating through the semiconductor layer when a substantially zero or a reverse bias voltage is applied across the semiconductor layer at the maximum operating temperature of the electro-absorption modulator.

An electronic data modulator may be electrically coupled to the electro-absorption modulator. An output of the electronic data modulator is electrically coupled to a modulation input of the electro-absorption modulator. The electronic data modulator generates an electrical modulation signal having a peak-to-peak voltage amplitude that changes the absorption edge of the semiconductor layer, thereby changing the light transmission characteristics of the electro-absorption modulator.

The modulation signal turns the EAM from optically transparent to optically opaque with an applied reverse bias voltage. The amplitude of the desired peak-to-peak voltage of the modulation signal (approximately 1 to 2.5 volts) changes with temperature as the EAM absorption changes as a function of temperature. The amplitude of the peak-to-peak voltage of the modulation signal depends on the desired light extinction characteristics. For example, to achieve an extinction ratio of about 13 dB, a peak-to-peak amplitude of between 1 to 2.5 volts at room temperature is required for some known materials.

In one embodiment, a temperature-driven controller is used. A temperature sensor is positioned in thermal communication with the semiconductor layer of the electro-absorption modulator or an active layer of a semiconductor laser that generates the light that propagates through the semiconductor layer of the EAM. The temperature-driven controller has an input that is electrically coupled to the thermal sensor and an output that is electrically coupled to a DC bias control input of the electronic data modulator.

The temperature-driven controller generates a signal that changes the DC bias of the electrical modulation signal generated by the electronic data modulator. The temperature-driven controller may include a processor that includes a look-up table that is used to determine various parameters, such as the desired DC bias voltage across the semiconductor layer for a particular temperature.

The present invention also features an electro-absorption modulated laser (EML) that includes a laser that generates light at an output. In one embodiment, the laser is a distributed feedback semiconductor laser. In one embodiment, a thermoelectric cooler is positioned in thermal communication with the laser. The thermoelectric cooler may be used to change a wavelength of the light generated by the laser. In one embodiment, the wavelength of the light generated by the laser is substantially 1310 nm or is substantially 1550 nm.

The electro-absorption modulated laser also includes an electro-absorption modulator that modulates the light generated by the laser. The laser and the electro-absorption modulator may be integrated onto a single substrate or may be physically separate devices.

The electro-absorption modulator includes a semiconductor layer having an electrically controllable absorption. The semiconductor layer may be a multi-quantum well layer or a bulk semiconductor layer. The material composition of the semiconductor layer is chosen so that the semiconductor layer is substantially transparent to light propagating through the semiconductor layer when a substantially zero or a reverse bias voltage is applied across the semiconductor layer at operating temperatures of the electro-absorption modulator that are substantially greater than 25 degrees Celsius. The material composition of the semiconductor layer may be chosen to modulate light that is substantially 1310 nm or that is substantially 1550 nm.

In one embodiment, the material composition of the electro-absorption modulator is chosen so that the semiconductor layer is substantially transparent to light propagating through the semiconductor layer when a substantially zero or a reverse bias voltage is applied across the semiconductor layer at the maximum operating temperature of the electro-absorption modulator.

The present invention also features a transmitter for an optical communication system or a transponder that includes a transmitter. In one embodiment, the transmitter generates optical signals having a wavelength that is substantially 1310 nm or substantially 1550 nm. In another embodiment, the transmitter generates optical signals at any desired communication wavelength for transmission via optical fiber or through the atmosphere.

The transmitter includes a laser that generates light at an output. The transmitter also includes an electro-absorption modulator with a semiconductor layer having an electrically controllable absorption. The material composition of the semiconductor layer is chosen so that the semiconductor layer is substantially transparent to light propagating through the semiconductor layer when a substantially zero or a reverse bias voltage is applied across the semiconductor layer at operating temperatures of the electro-absorption modulator that are substantially greater than 25 degrees Celsius.

An electronic data modulator modulates the light generated by the laser. The electronic data modulator has an output that is electrically coupled to a modulation input of the electro-absorption modulator. The electronic data modulator generates an electrical modulation signal having a peak-to-peak voltage amplitude that changes the absorption edge of the semiconductor layer, thereby changing the light transmission characteristics of the electro-absorption modulator.

A temperature sensor is positioned in thermal communication with at least one of the semiconductor laser and the semiconductor layer of the electro-absorption modulator. The transmitter includes a temperature-driven controller that has an input that is electrically coupled to the thermal sensor and an output that is electrically coupled to a DC bias control input of the electronic data modulator.

The temperature-driven controller generates a signal that changes the DC bias of the electrical modulation signal generated by the electronic data modulator. The temperature-driven controller may include a processor that includes a look-up table that is used to determine various parameters, such as the desired DC bias voltage across the semiconductor layer for a particular temperature.

The present invention also features a method of generating data modulated light. The method includes generating light and then propagating the light through a semiconductor layer having an electrically controllable absorption. The semiconductor layer has a material composition that is chosen so that the semiconductor layer is substantially transparent to light propagating through the semiconductor layer when a substantially zero or a reverse bias voltage is applied across the semiconductor layer at operating temperatures of the electro-absorption modulator that are substantially greater than 25 degrees Celsius.

The method also includes elevating the temperature of the semiconductor layer above 25 degrees Celsius. A DC reverse bias voltage is applied across the semiconductor layer. A modulation signal having a voltage is applied across the semiconductor layer. The modulation signal changes an absorption edge of the semiconductor layer, thereby modulating the light.

In one embodiment, the temperature of the semiconductor layer or a laser that generates the light is measured, and the DC bias voltage applied across the semiconductor layer is changed in response to the measured temperature. In another embodiment, the temperature of the semiconductor layer or a laser that generates the light is measured, and the bias current driving a laser that generates the light is changed in response to the measured temperature.

The present invention also features a method of tracking a temperature of an electro-absorption modulator to a temperature of a semiconductor laser. The method includes generating light with a semiconductor laser. The light is propagated through an electro-absorption modulator comprising a semiconductor layer having an electrically controllable absorption. The semiconductor layer has a material composition that is chosen so that the semiconductor layer is substantially transparent to light propagating through the semiconductor layer when a substantially zero or a reverse bias voltage is applied across the semiconductor layer at operating temperatures of the electro-absorption modulator that are substantially greater than 25 degrees Celsius.

A modulation signal having a peak-to-peak voltage amplitude of, for example, 1.0 to 2.5 volts, is applied across the semiconductor layer. The modulation signal changes the absorption edge of the semiconductor layer, thereby changing the light transmission characteristics of the electro-absorption modulator and modulating the light generated by the laser. The temperature of the laser that generates the light is measured and the peak-to-peak voltage amplitude of the electrical modulation signal is changed in response to the measured temperature so that a desired extinction ratio of the transmitted light is attained. By extinction ratio we mean:

$$-10\log\left[\frac{I_{out}}{I_{in}}\right]$$

where $I_{out}$ is the intensity through the EAM and $I_{in}$ is the incident EAM intensity.

BRIEF DESCRIPTION OF THE DRAWINGS

This invention is described with particularity in the below description. The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Figure 1:
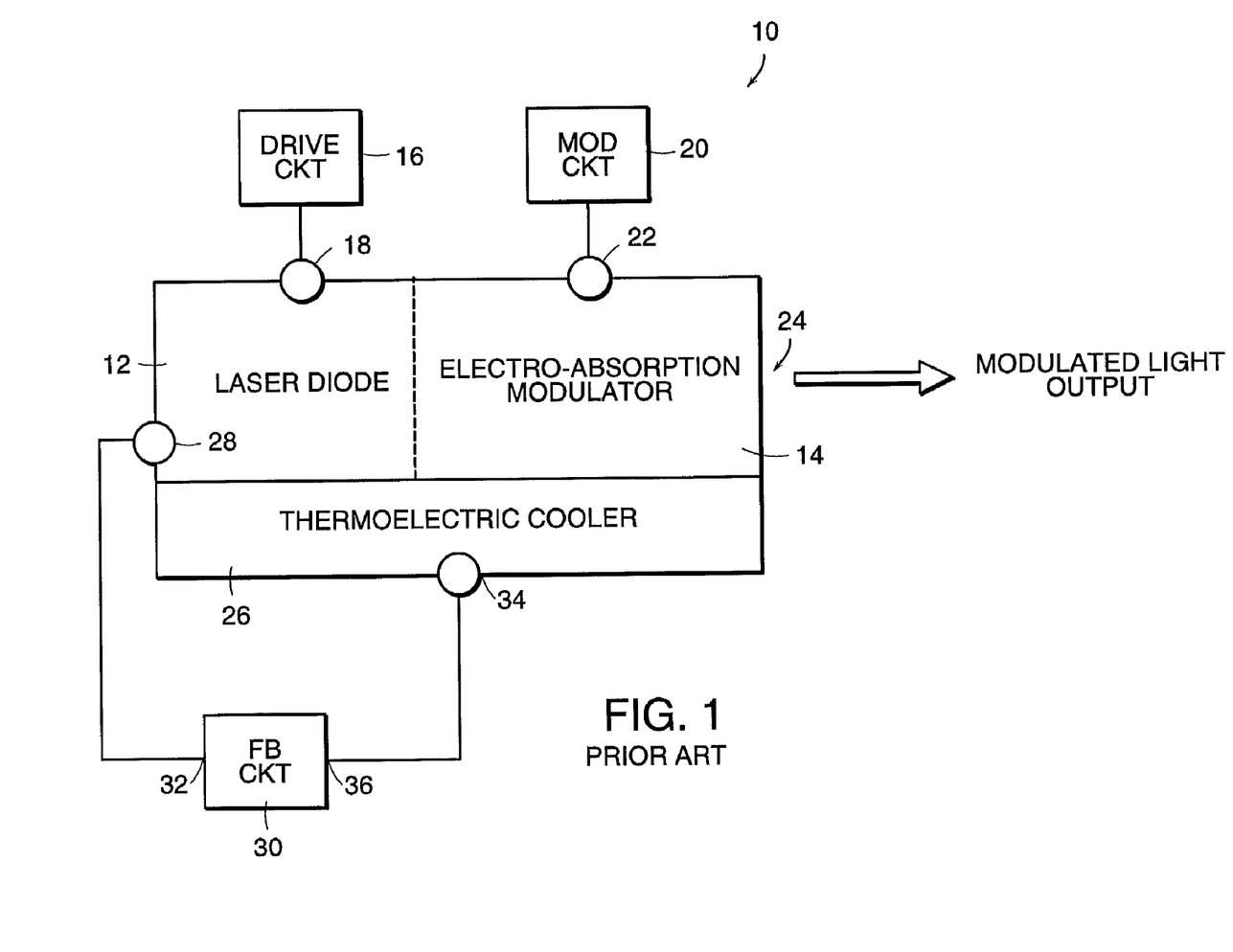
FIG. 1 illustrates a typical prior art electro-absorption modulated laser.

FIG. 1 illustrates a prior art electro-absorption modulated laser (EML) 10. The EML 10 includes a laser diode 12 section and an electro-absorption modulator (EAM) 14 section. The laser diode 12 section is typically a distributed feedback (DFB) laser. The EAM 14 is typically a device that includes a semiconductor layer, such as a multi-quantum well semiconductor layer. The semiconductor layer typically has a slightly larger bandgap than the photon energy of the light being modulated. The laser diode 12 section is optically coupled to the EAM 14 section. The laser diode 12 section and EAM section 14 are typically integrated onto a single substrate, but can be physically separate devices.

An electronic laser drive circuit 16 is electrically coupled to a bias input 18 of the laser diode 12. The electronic laser drive circuit 16 generates a continuous wave (CW) current that drives the laser diode 12, thereby causing the laser diode 12 to emit substantially monochromatic light of a predetermined wavelength. An electronic data modulation circuit 20 is electrically coupled to a modulation input 22 of the EAM 14.

The electronic data modulator circuit 20 generates a voltage across the multi-quantum well semiconductor layer that produces a reverse bias electric field across the semiconductor layer. The reverse bias electric field causes the absorption edge of the semiconductor layer to reversibly move to a longer wavelength (i.e., the reverse bias field lowers the absorption edge). The shift in the absorption edge causes the semiconductor layer to absorb the light generated by the laser diode 12 section that propagates through the semiconductor layer.

Reducing the voltage across the multi-quantum well semiconductor layer results in the elimination or reduction of the reverse bias electric field, which in turn causes the semiconductor layer to allow light generated by the laser diode 12 to transmit through the semiconductor layer. Therefore, light emitted from the laser diode 12 that propagates to the EAM 14 can be modulated by modulating the voltage across the multi-quantum well semiconductor layer between a sufficient reverse bias voltage across the semiconductor layer that causes the layer to be substantially opaque to the light emitted from the laser diode 12, and substantially zero or a sufficiently positive bias voltage that causes the layer to be substantially transparent to the light emitted from the laser diode 12.

The resulting modulated light is emitted at an optical output 24 of the EML 10. The optical output 24 can be directly coupled to an optical transport medium (not shown), such as an optical fiber, or can be coupled to an optical transport medium through a lens transport system. The wavelength of the modulated light can be controlled by adjusting the amplitude of the CW current generated by the electronic laser drive circuit 16 and applied to the laser diode 12. The wavelength of the modulated light can also be controlled by adjusting the temperature of the laser diode 12.

Common prior art EML 10 devices include a thermoelectric cooler (TEC) 26 that controls the temperature of the laser diode 12 and EAM 14. The temperature of the EML 10 can be stabilized by using a thermal sensor 28 and a feedback circuit 30. The thermal sensor 28 is thermally coupled to the laser diode 12 and is electrically coupled to a feedback circuit 30 at an input 32. The feedback circuit 30 is electrically coupled to the TEC 26 at an input 34. The feedback circuit 30 receives a signal from the thermal sensor 28 at the input 32 that is related to the measured temperature of the laser diode 12 and generates a signal at an output 36 in response to the measured temperature. The signal generated by the feedback circuit 30 controls the thermal properties of the TEC 26 to maintain the laser diode 12 at a predetermined operating temperature (and thus the major portion of spectral energy of the emitted light at the desired wavelength) independent of ambient temperature.

Figure 2:
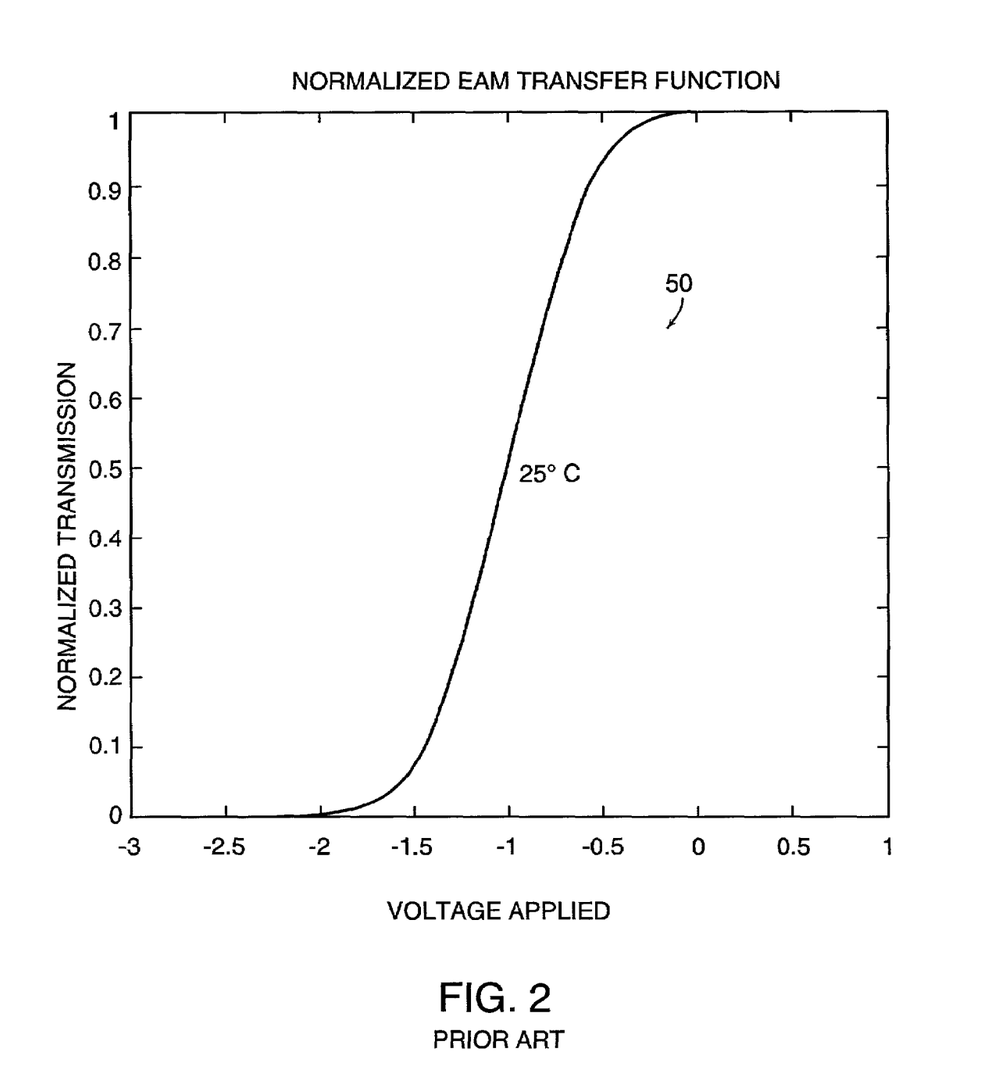
FIG. 2 illustrates a normalized light transmission response for a particular operating wavelength of light as a function of applied voltage for a prior art EAM section of an EML that is optimized to operate at room temperature.

FIG. 2 illustrates a normalized light transmission response 50 at a particular wavelength of light for an EML as a function of applied voltage for a prior art EAM section of an EML optimized to operate at room temperature. By room temperature, we mean an ambient room temperature that is approximately 25° C. The applied voltage is a reverse bias voltage that generates a reverse bias electric field across the semiconductor layer of the EAM. The reverse bias electric field causes the absorption edge of the semiconductor material to shift to a longer wavelength (i.e., a lower absorption edge). The shift in the absorption edge causes the semiconductor layer to absorb at least a portion of the light transmitted from the laser diode. Removal or cancellation of all or a substantial part of the reverse bias voltage results in the absorption edge shifting back to a shorter wavelength.

The normalized light transmission response 50 is for an EAM semiconductor structure that is designed to be substantially transparent to the light emitted by the laser diode with an EAM at substantially zero bias (i.e., no applied bias voltage across the semiconductor layer of the EAM). When a reverse bias is applied across the semiconductor layer, the absorption edge of the EAM semiconductor layer is shifted to a longer wavelength and, consequently, the EAM begins to absorb a portion of the light transmitted from the laser diode. FIG. 2 illustrates that, when the reverse bias is approximately 2 volts in magnitude, the EAM semiconductor layer absorbs substantially all of the light and essentially no light is transmitted from the EML.

Figure 3:
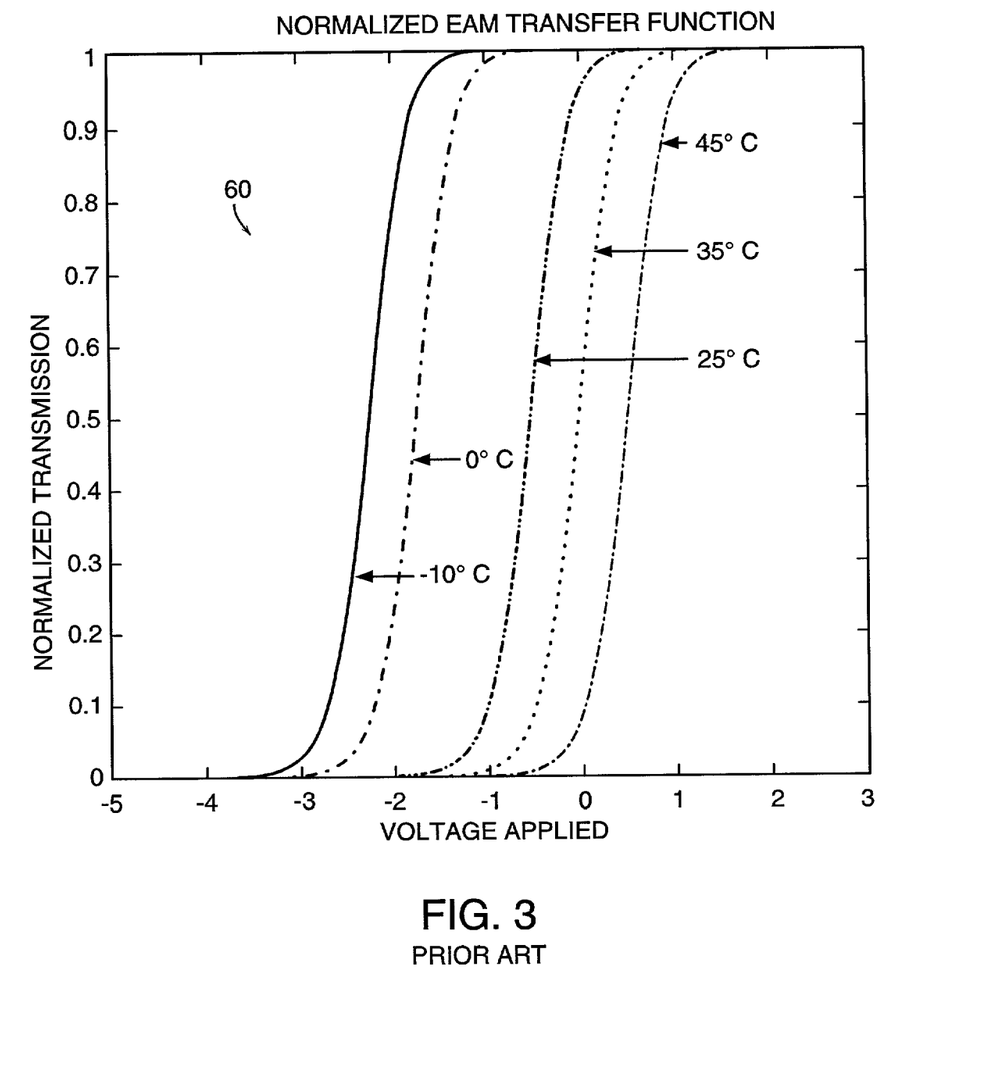
FIG. 3 illustrates a theoretical family of normalized transmission responses as a function of applied voltage for a prior art electro-absorption modulator at five different temperatures.

FIG. 3 illustrates a theoretical family of normalized transmission responses 60 as a function of applied voltage for a prior art electro-absorption modulator. The normalized transmission responses 60 are illustrated for five temperatures ranging from −10° C. to +45° C. This temperature range represents a portion of the 0–65° C. case temperature range specification found in the Multi-Source Agreement (MSA) Reference Document for 300 pin 10 Gb Transponder. The theoretical family of normalized transmission responses 60 indicates that in order to achieve a particular normalized transmission level, the magnitude of the required reverse bias voltage across the semiconductor layer decreases as the ambient temperature increases.

At elevated temperatures (approximately 35° C. and above), the theoretical family of normalized transmission responses 60 indicates that prior art EAMs, which are optimized to operate at room temperature (approximately 25° C.), would require a positive voltage to cause the EAM to absorb light. However, generally semiconductor EAMs cannot reliably operate with positive voltages (substantially greater than 0.5 volts). Semiconductor EAMs typically require a reverse bias voltage across the semiconductor layer to move the absorption edge to a longer wavelength thus causing the EAM to absorb the light emitted from the laser diode. Therefore, the theoretical family of normalized transmission responses 60 indicates that prior art EAMs do not function suitably (i.e. absorb light) at temperatures substantially greater than room temperature.

Applicants have discovered that an EAM can be constructed to achieve a wide operating temperature range by designing the semiconductor layer of the EAM so that a substantially zero (meaning zero or slightly positive voltage, for instance, +0.5 volts) or reverse bias voltage applied across the semiconductor layer causes substantially all light propagating from the laser diode to transmit through the EAM at relatively high operating temperatures or at the maximum operating temperature of the EAM. This is achieved, in one embodiment, by engineering the semiconductor layer to be substantially transparent to light propagating through the semiconductor layer when a substantially zero or reverse bias voltage is applied across the semiconductor layer at a relatively high operating temperature, for example, 70° C. for MSA applications, or a higher temperature for special application.

Such an EAM is desirable because it can be operated without external cooling for many applications. Thus, such an EML or separate laser and EAM would be relatively inexpensive, would consume less power and would require less space compared with known EMLs and separate EAMs. However, although not required, an EAM according to the present invention can be used with external cooling if desired.

Figure 4A:
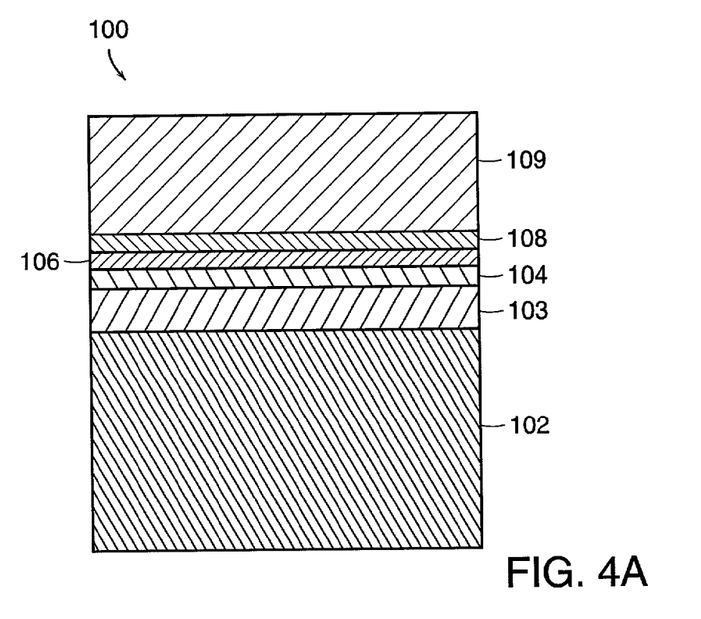
FIG. 4A is a diagram of one embodiment of a semiconductor layer material structure before etching and regrowth of a typical distributed feedback laser diode section of an EML according to the present invention.

FIG. 4A is a diagram of a semiconductor layer material structure 100 before etching and regrowth of a distributed feedback (DFB) laser diode section of an EML according to the present invention. The semiconductor layer material structure 100 comprises a multi-quantum well structure. Multiple quantum well structures are often used in semiconductor laser diode regions because they provide high gain and, consequently, low threshold current and high emission power. In one embodiment, the quantum well thickness and composition is chosen so that the peak of the gain is at or close to the desired operating wavelength and the periodicity of the underlying structure is chosen so that the laser emission is at the desired wavelength.

In one embodiment, the semiconductor layer material structure 100 is a strained layer (SL) multiple quantum well structure. The strained layer has a biaxial strain that causes a splitting of the valence sub-bands. Specifically, the axial component of a hydrostatic strain causes the heavy hole (hh) and the light hole (lh) states to split near the k=0 point for both tensile-strained (TS) and compressively-strained (CS) multiple quantum wells. The strained layer reduces the effective mass of the top-most valence sub-band.

Strained multiple quantum well layers have numerous advantages over unstrained multiple quantum well layers. For example, the use of strained multiple quantum well layers results in better carrier confinement, which reduces the threshold current of the laser. Strained multiple quantum well layers also result in a relatively high differential gain compared with unstrained multiple quantum well layers. In addition, strained multiple quantum well layers have relatively low Auger recombination, which improves efficiency. Furthermore, the strain multiple quantum well layers have a smaller fill-in-factor that can result in a higher saturation optical power level in the optical cavity. The higher saturation optical power level optimizes the laser for moderate to high power operation, which is desirable for some telecommunication applications.

Commercial EMLs are typically optimized for use in optical fiber communication systems, such as wavelength division multiplexed (WDM) optical communication systems. The performance of these EMLs can be significantly affected by feedback from the EAM section of the EML to the laser diode section of the EML. This feedback can cause a chirp in the lasing wavelength. The feedback may be optical, electrical or a combination of optical and electrical feedback.

In one embodiment of the invention, the optical isolation between the laser diode section and the EAM section of the EML is sufficiently high to minimize the feedback from the emitting facet of the EAM section to the laser diode section of the EML. For example, the optical isolation between the laser diode section and the EAM section of the EML may be greater than 30 dB. In one embodiment, a grating isolation section is used to improve the optical isolation. In another embodiment, an attenuation section is used to improve the optical isolation. The grating isolation and attenuation sections generally add optical loss that reduces the optical power emitted from the EML. In one embodiment, the grating isolation section and attenuation section are designed to minimize the loss.

In one embodiment, the DFB laser is designed to emit relatively narrow emission spectra compared with Fabry-Perot cavity lasers. Narrower emission spectra can be achieved by choosing the appropriate parameters for the DFB grating. In one embodiment, the grating is positioned at an angle relative to the optical waveguide in order to improve stability of the emission wavelength. Such a structure can result in high power lasers having relatively narrow linewidths.

In one embodiment, the semiconductor layer material structure 100 is grown using multi-step metal-organic chemical vapor deposition (MOCVD) growth. However, other known methods of crystal growth can be used to grow the material structure 100. In one embodiment, the semiconductor layer material structure 100 is grown on an indium phosphide (InP) substrate 102. The DFB grating can be fabricated on the substrate 102 before the initial growth or can be fabricated on the top surface after the first re-growth.

Specifically, FIG. 4A illustrates a material structure 100 that includes an n-doped InP 103 cladding layer that is grown on the InP substrate 102. The material structure 100 also includes a lower waveguiding layer 104 that, in one embodiment, has a 1.1 µm bandgap n-doped $In_{1-x}Ga_xAs_yP_{1-y}$ (x=0.14, y=0.33) quaternary layer that is lattice matched to the InP substrate 102. In one embodiment, the lower waveguiding layer 104 is an n-doped InGaAsP layer 104 that has a bandgap of 1.10 µm.

In addition, the material structure 100 includes an active layer 106 comprising compressive strained multiple quantum well (CSMQWs) layers. For example, a strained $In_{1-x}Ga_xAs_yP_{1-y}$ (x=0.14, y=0.52) layer, which has a material bandgap of 1.42 µm, may be used as the quantum well. For example, 7.5 nm-thick strained quantum wells provide stable light output versus current characteristics at elevated temperature substantially greater than 35° C., at a wavelength of 1.31 µm.

The material structure 100 also includes an upper waveguiding layer 108 that, in one embodiment, is a 1.1 µm bandgap p-doped $In_{1-x}Ga_xAs_yP_{1-y}$ (x=0.14, y=0.33) quaternary layer that is lattice matched to the InP substrate 102. In one embodiment, the upper waveguiding layer 108 has substantially the same bandgap as the lower waveguiding layer 104. The material structure 100 also includes a p-doped InP 109 cladding layer.

Figure 4B:
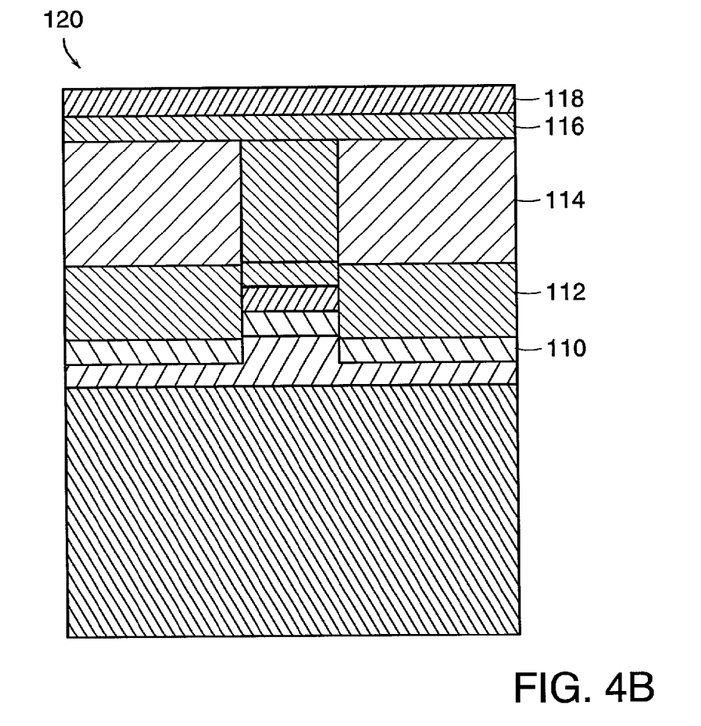
FIG. 4B illustrates a diagram of one embodiment of a semiconductor layer material structure 100 after etching and regrowth of a distributed feedback (DFB) laser diode section of an EML according to the present invention.

FIG. 4b illustrates a diagram of one embodiment of a semiconductor layer material structure 100 after etching and regrowth of a distributed feedback (DFB) laser diode section of an EML according to the present invention. A narrow mesa is etched using etching techniques that are well known in the art. The material structure 100 is then prepared for LP-MOCVD regrowth. The first regrowth layers include current confinement layers that are grown on both sides of the mesa. The current confinement layers 110, 112, 114 provide lateral current confinement so that the majority of the injected current flows through the multiple quantum well layers 106 (FIG. 4A). In one embodiment, the current confinement layers include n-doped InP 110/p-doped InGaAsP 112/n-doped InP 114 layers.

The first regrowth layers also include an InGaAsP layer 112 that is grown on top of the current confinement layer 110. In one embodiment, the InGaAsP layer 112 has a bandgap wavelength that is approximately 1.2 µm. The InGaAsP layer 112 provides a lateral optical index profile that is suitable for stable single mode operation.

A second regrowth is then performed, as shown in FIG. 4b. In one embodiment, the second regrowth layers include a p-doped InP layer 116 and a p-InGaAs layer 118. The second regrowth layers planarize the semiconductor material structure 120 after the first regrowth. Also, the second regrowth layers provide a broad area for a low resistance electrical contact. In addition, the second regrowth layers provide a good thermal contact.

In one embodiment, the quaternary layers 104 (FIG. 4A), 108 (FIG. 4A), and 112 (FIG. 4B) are grown by low-pressure metal organic vapor phase deposition (LP-MOCVD). Interdiffusion across the interface during MOCVD growth is significantly reduced because the quantum wells and the barrier layers in the active layer 106 (FIG. 4A) contain the same elements. Interdiffusion is further reduced when these layers are grown at relatively low temperatures (for example, approximately 550–600° C.). In one embodiment, a change of composition is achieved by adjusting the flow rate of the gaseous Group V compounds.

In one embodiment, the material structure of the EAM section of EML is similar to the material structure 100 described in connection with FIGS. 4A and 4B. However, the multi-quantum well structure of the EAM section is designed so that the bandgap energy of the material corresponds to a wavelength that is shorter than the lasing wavelength of the DFB laser. The absorption in the multi-quantum well region is primarily due to excitonic effects, which results in a relatively sharp absorption edge compared with bulk semiconductor layers. As a result, larger field effects occur over a narrow wavelength range, which increases the temperature sensitivity of the EAM with wavelength compared with bulk semiconductor layers.

In one embodiment, the semiconductor layer material structure of an EAM according to the present invention has a tensile strain in the multi-quantum well region that reduces the temperature sensitivity with wavelength. The tensile strain causes splitting of the valence sub-bands and a reduction of the heavy hole mass. For example, in one embodiment, the EAM is designed to operate at substantially 1310 nm and the semiconductor layers of the EAM include 0.4% tensile-strained quantum wells with a zero-electric-field absorption edge at approximately 1.26 µm. The active region is cladded by two InGaAsP layers to form a relatively large optical cavity waveguide. In one embodiment, the semiconductor layer of the EAM of the present invention is also designed to have a relatively low voltage sensitivity with respect to wavelength.

Numerous other semiconductor layer material structures can be used with an EAM and EML according to the present invention. Furthermore, numerous other types of semiconductor laser diode regions can be used with the EML of the present application. In fact, any type of laser emitting light at the desired wavelength can be used with the EML and EAM of the present invention.

The present invention also features an electronic control circuit that compensates for the inherent temperature drift in performance of an EAM or EML over a wide temperature range. The control circuit changes at least one of the EAM DC bias voltage, the peak-to-peak voltage amplitude of the modulation signal, and the laser bias current as functions of operating temperature to allow the EML or separate laser and EAM to operate over a wide operating temperature range.

Figure 5:
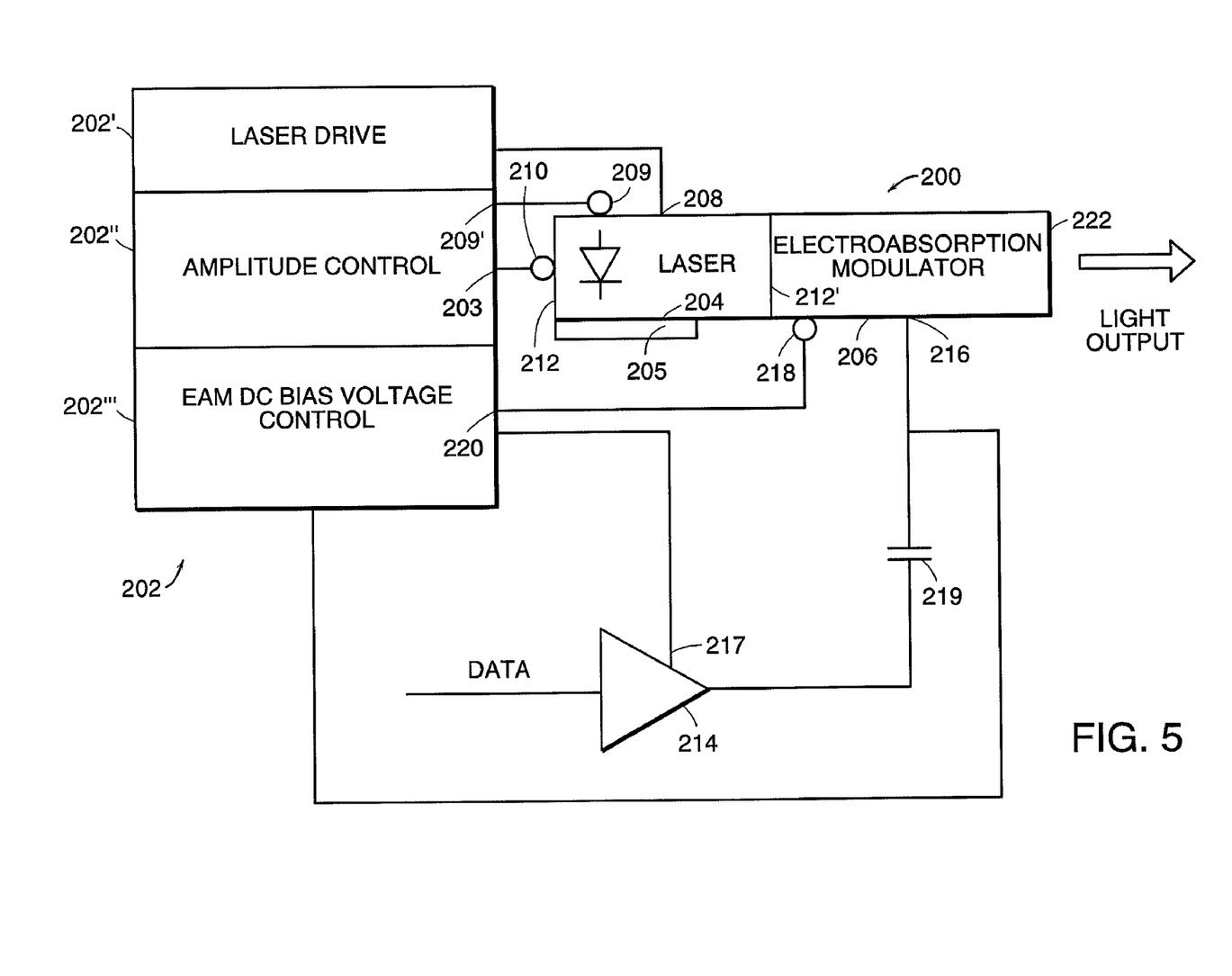
FIG. 5 illustrates a functional block diagram of an electro-absorption modulated laser and control circuit according to the present invention.

FIG. 5 illustrates a functional block diagram of an electro-absorption modulated laser (EML) 200 and control circuit 202 according to one aspect of the present invention. The EML 200 includes a laser diode 204 section and an electro-absorption modulator (EAM) 206 section. In one embodiment, the laser diode 204 is a distributed feedback (DFB) laser and the EAM 206 comprises a multi-quantum well device that includes the material structure described in connection with FIGS. 4A and 4B. In one embodiment, the laser diode 204 and EAM 206 are integrated onto a single substrate. In other embodiments, the laser diode 204 and EAM 206 are physically separate devices.

In one embodiment, the EML 200 can include a thermoelectric cooler 205 that is in thermal communication with the laser diode 204. When employed, the thermoelectric cooler 205 can be used to control the temperature of the laser diode 204 in order to change the wavelength of the light generated by the laser diode 204. For example, a temperature rise of 10° C. (from, for example, room temperature) in a typical DFB laser diode can cause the wavelength of the emission to increase by approximately The control circuit 202 includes an electronic laser drive circuit 202', or bias control circuit, that is electrically coupled to a bias input 208 of the laser diode 204. The electronic laser drive circuit 202' generates a continuous wave (CW) current that drives the laser diode 204 causing it to emit photons. The control circuit 202 also includes an amplitude control circuit 202" that is electrically connected to the laser drive circuit 202'. The amplitude control circuit 202" controls the amplitude of the CW current that is generated by laser drive circuit 202'.

In one embodiment, a temperature sensor 209 is positioned in thermal communication with the laser diode 204. The output of the temperature sensor 209 is electrically connected to an input 209' of the amplitude control circuit 202." The temperature sensor 209 generates a signal at the output that is related to the temperature of the laser 204. The amplitude control circuit 202" is slaved to the temperature of the laser 204. The amplitude control circuit 202" receives the signal generated by the temperature sensor 209 at the input 209' and generates a signal that instructs the electronic laser drive circuit 202' to change the CW current that drives the laser diode 204 in response to the measured temperature so as to control the wavelength of the light emitted by the laser diode 204.

In one embodiment, the optical power emitted from the laser diode 204 is monitored by an optical power detector 210 that is positioned in optical communication with the back facet 212 of the laser diode 204. In other embodiments, an optical power detector (not shown) is in optical communication with the front facet 212' of the laser diode 204. The optical power detector 210 generates an electrical signal that is related to the optical power emitted by the laser diode 204 that propagates into the EAM 206. The amplitude control circuit 202" has an input 203 that is electrically connected to the output of the optical power detector 210. The amplitude control circuit 202" generates a signal that instructs the laser drive circuit 202' to generate a CW current having a predetermined amplitude in response to the optical power emitted from the laser diode 204.

An electronic data modulation circuit 214 is electrically coupled to a modulation input 216 of the EAM 206. In one embodiment, the electronic data modulation circuit 214 is capacitively coupled to the modulation input 216 of the EAM 206 by a capacitor 219. The electronic data modulation circuit 214 generates a modulation signal that reverse biases the EAM 206 and causes the EAM 206 to modulate the light emitted from the laser diode 204 that propagates into the EAM 206 by either transmitting the light through the EAM 206 or by absorbing the light within the EAM 206.

The control circuit 202 also includes an EAM DC bias voltage control circuit 202'" that is electrically connected to a control input 217 of the data modulation circuit 214. In one embodiment, a temperature sensor 218 is positioned in thermal communication with the EAM 206. The temperature sensor 218 generates a signal at an output that is related to the temperature of the EAM 206. The EAM DC bias voltage control circuit 202'" includes an input 220 that is electrically coupled to the output of the temperature sensor 218. In this embodiment, the EAM DC bias voltage control circuit 202'" is slaved to the temperature of the EAM 206. The EAM DC bias voltage control circuit 202'" receives the signal generated by the temperature sensor 218 at the input 220 and generates a signal that instructs the data modulation circuit 214 to change the DC bias voltage applied to the EAM 206 in response to the measured temperature so as to control the absorption edge of the EAM 206.

The light modulated by the EAM 206 is emitted at an optical output 222 of the EML 200. The optical output 222 may be directly coupled to an optical transport medium (not shown), such as an optical fiber, a lens transport system or free space. The wavelength of the modulated light is controlled by adjusting the CW current generated by the laser drive circuit 202' and applied to the bias input 208 of the laser diode 204. The wavelength of the modulated light can also be controlled by adjusting the temperature of the laser diode 204.

Figure 6:
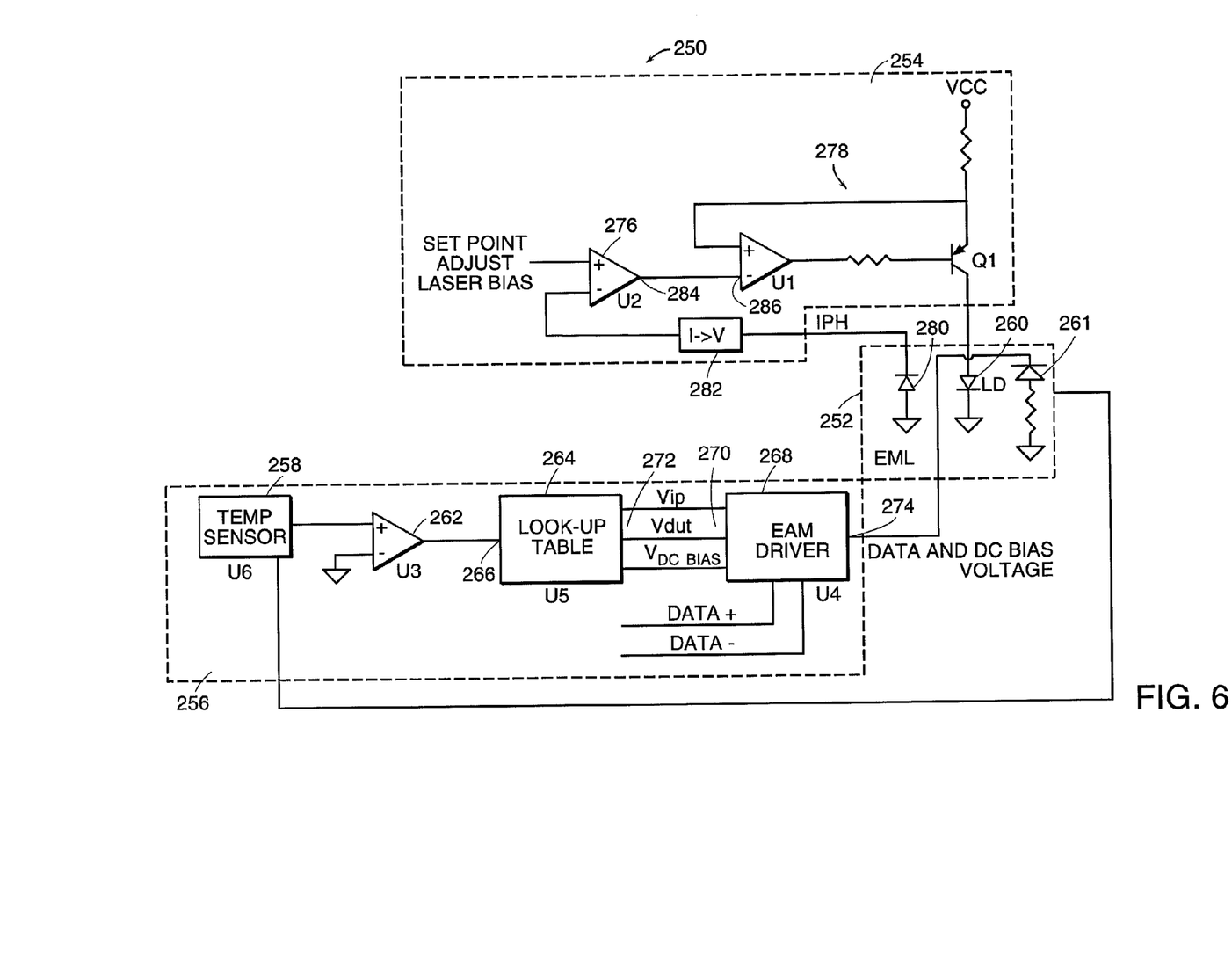
FIG. 6 illustrates a functional block diagram of one embodiment of a control circuit of an electro-absorption modulated laser according to the present invention.

FIG. 6 illustrates a functional block diagram of one embodiment of a control circuit 250 of an EML 252 according to the present invention. The control circuit 250 includes a laser diode driver circuit 254 and an EAM driver circuit 256. The EAM driver circuit 256 includes a thermal sensor 258 that measures the temperature of the laser diode 260 in the EML 252. The thermal sensor 258 generates a signal having a voltage that is proportional to the temperature of the laser diode 260. An amplifier 262 amplifies the signal generated by the thermal sensor 258 to a signal level that can be easily processed. A processor 264, which can include a look-up table, receives the amplified signal from the amplifier 262 at an input 266.

The control circuit 250 includes an EAM driver 268 that has an input 270 that is electrically connected to an output 272 of the processor 264 so that a DC bias voltage, $V_{DC\ Bias}$ can be applied to the EAM driver 268. The EAM driver 268 has an output 274 that is electrically connected to the EAM 261. In one embodiment, the processor 264 uses the look-up table to determine the appropriate DC bias voltage for the EAM 261. The processor 264 generates a signal that instructs the EAM driver 268 to generate the appropriate DC bias voltage.

The laser diode driver circuit 254 includes a set-point voltage circuit 276 and a laser diode driver 278. The set-point voltage circuit 276 can be a voltage comparator. In one embodiment, an optical detector 280 is optically coupled to the back or front facet of the laser diode 260. The optical detector 280 generates a monitor current (Iph). A circuit 282 is electrically connected to the output of the optical detector 280 and converts the monitor current (Iph) to a reference voltage. The output of the circuit 282 is electrically connected to one input of the set-point voltage circuit 276. In the embodiment shown, the set-point voltage circuit 276 is a voltage comparator. The set-point voltage circuit 276 compares the reference voltage to a set-point voltage applied to another input of the set-point voltage circuit 276 (and in particular, in the embodiment shown, to the non-inverting input of the comparator) and generates a control signal at an output 284 that is a function of a comparison of the two input signals.

The laser diode driver 278 is electrically connected to the output 284 of the set-point voltage circuit 276. In one embodiment, the laser diode driver 278 includes an op-amp (U1) and a transistor (Q1). The laser diode driver 278 receives the control signal at an input 286 and generates a laser drive current. The set-point voltage can be adjusted to adjust the drive current of the laser diode 260 to meet the power output requirements of the EML 252.

The control circuit 250 can be used to drive the EML 252 so that the EML 252 generates an optical signal that has a substantially optimal transmitter eye pattern over the entire temperature operating range of approximately 0° C. to 70° C. for MSA applications, or a higher temperature for special applications. The control circuit 250 of the present invention can be practiced with many other known configurations.

Figure 7:
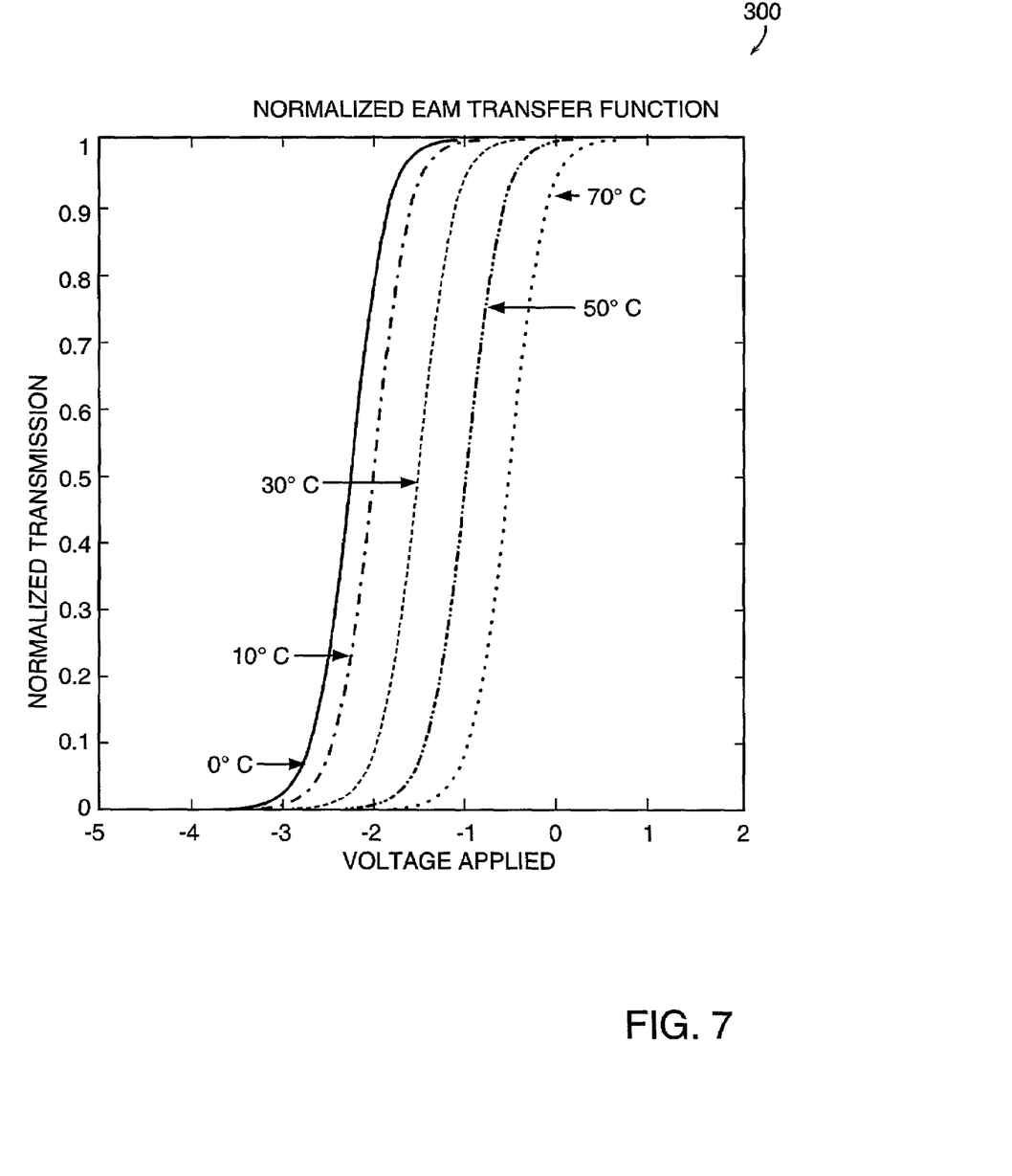
FIG. 7 illustrates a family of theoretical normalized transmission responses as a function of applied voltage at various operating temperatures for one embodiment of an electro-absorption modulator according to the present invention.

FIG. 7 illustrates a family of normalized transmission responses 300 for a particular operating wavelength over a range of temperatures as a function of applied voltage for one embodiment of an EAM according to the present invention. The EAM material structure for this embodiment is designed as described herein to operate with an applied reverse bias voltage through the entire operating temperature range up to the maximum temperature requirement of 70° C. for MSA applications, or a higher temperature for special application.

The transmission responses 300 of the EAM according to the present invention indicate wavelength shifts that are approximately 0.59 nm/° C. at an operating wavelength of approximately 1310 nm. The transmission responses 300 also indicate wavelength shifts that are approximately 41.3 nm over a temperature range of 70° C. for MSA applications. For example, a DFB laser with a wavelength shift of approximately 0.08 nm/° C., will exhibit a total wavelength shift over of approximately 5.6 nm over the 70° C. operating temperature range of approximately 0° C. to 70° C.

In one embodiment in which an EAM and DFB laser diode are integrated on the same substrate and fabricated with the same material structure, both devices will experience a positive wavelength shift with temperature. Therefore, the differential shift for the integrated EML including both the EAM and the DBF laser will be approximately 35.7 nm (41.3 nm-5.6 nm) over a 70° C. operating temperature range (from approximately 0° C. to 70° C.). Data also indicates that the EAM can be tuned by 21 nm with 2V of reverse bias voltage applied. Therefore, the entire range of the temperature from 0° C. to 70° C. can be compensated with an electronic control circuit that provides a range of approximately 3.4V of reverse bias to the EAM, i.e., approximately 0VDC to approximately −3.4VDC.

Figure 8:
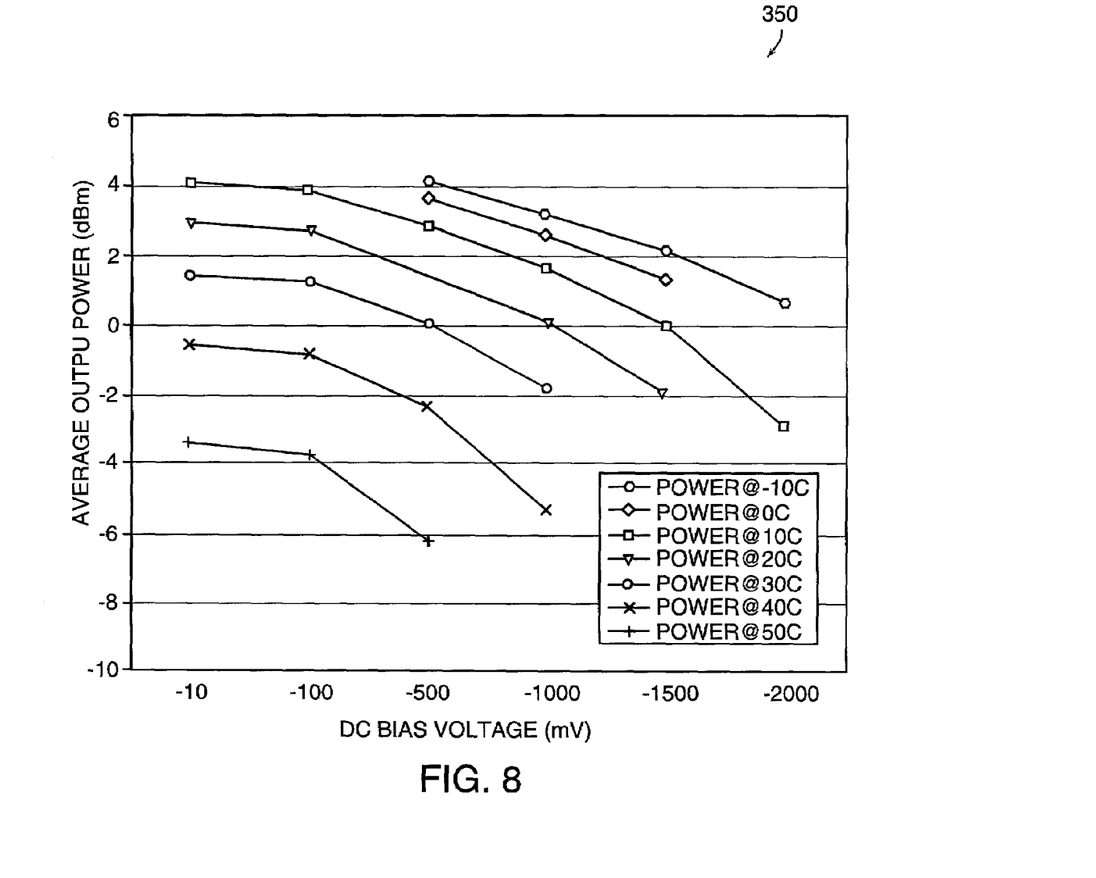
FIG. 8 illustrates experimental data for output power as a function of bias voltage at various operating temperatures for one embodiment of an electro-absorption modulated laser according to the present invention.

FIG. 8 illustrates experimental data 350 for output power as a function of EAM bias voltage and operating temperature for an EML according to the present invention. The bias voltage ranges from ~0V to −2V for several operating temperatures. These data demonstrate that an EML according to the present invention can operate over a wide temperature range without the use of an external cooling device.

An EML according to the present invention can operate within the MSA operating temperature specifications without the use of an external cooling element, such as a thermoelectric cooler. Such an EML is advantageous because external cooling increases the power and space requirements, and adds to the cost of the device.

Known EMLs using a control circuit according to the present invention have achieved performance that meets the SONET signal "eye" requirements over a 47° C. temperature range of −7° C. to 40° C. (the lower temperature of −7° C. was limited by test equipment). An EML with a material structure engineered according to the present invention and using a control circuit according to the present invention can also be used to achieve temperature stability performance over 0° C. to 70° C. for MSA applications, or a higher temperature for special application.

EQUIVALENTS

While the invention has been particularly shown and described with reference to specific preferred embodiments, it should be understood by those skilled in the art that various changes in form and detail may be made therein without departing from the spirit and scope of the invention as defined herein. For example, an EAM according to the present invention can be used with any type of laser and is not limited to the use with a DFB semiconductor laser diode.

What is claimed is:

1. An electro-absorption modulator comprising a semiconductor layer having an electrically controllable absorption, a material composition of the semiconductor layer being chosen so that a transmission response of the modulator as a function of applied voltage shifts with an increasing operating temperature of the modulator so that the semiconductor layer is substantially transparent to light propagating through the semiconductor layer when a substantially zero or a reverse bias voltage is applied across the semiconductor layer at operating temperatures of the modulator that are substantially greater than 25 degrees Celsius.

2. The electro-absorption modulator of claim 1 wherein the semiconductor layer comprises a multi-quantum well layer.

3. The electra-absorption modulator of claim 2 wherein the multi-quantum well layer comprises a compressive strain that is sufficient to shift the transmission response of the modulator with increasing operating temperature so that the semiconductor layer is substantially transparent to light propagating through the semiconductor layer when a substantially zero or a reverse bias voltage is applied across the semiconductor layer.

4. The electro-absorption modulator of claim 1 wherein the semiconductor layer comprises a bulk semiconductor layer.

5. The electro-absorption modulator of claim 1 wherein a wavelength of the light propagating through the semiconductor layer is substantially 1310 nm.

6. The electro-absorption modulator of claim 1 wherein a wavelength of the light propagating through the semiconductor layer is substantially 1550 nm.

7. The electro-absorption modulator of claim 1 wherein the material composition of the semiconductor layer is chosen so that the transmission response of the modulator as a function of applied voltage shifts with increasing operating temperature of the modulator so that the semiconductor layer is substantially transparent to light propagating through the semiconductor layer when a substantially zero or a reverse bias voltage is applied across the semiconductor layer at operating temperatures of the electro-absorption modulator that are substantially greater than 35 degrees Celsius.

8. The electro-absorption modulator of claim 1 wherein the material composition of the semiconductor layer is chosen so that the transmission response of the modulator as a function of applied voltage shifts with increasing operating temperature of the modulator so that the semiconductor layer is substantially transparent to light propagating through the semiconductor layer when a substantially zero or a reverse bias voltage is applied across the semiconductor layer at operating temperatures of the electro-absorption modulator that are substantially greater than 45 degrees Celsius.

9. The electro-absorption modulator of claim 1 wherein the material composition of the semiconductor layer is chosen so that the transmission response of the modulator as a function of applied voltage shifts with increasing operating temperature of the modulator so tat the semiconductor layer is substantially transparent to light propagating through the semiconductor layer when a substantially zero or a reverse bias voltage is applied across the semiconductor layer at a maximum operating temperature of one of the electro-absorption modulator or a laser that generates the light.

10. The electro-absorption modulator of claim 1 further comprising an electronic data modulator having an output that is electrically coupled to a modulation input of the electro-absorption modulator, the electronic data modulator generating an AC electrical modulation signal having a peak-to-peak voltage amplitude that changes an absorption edge of the semiconductor layer, thereby changing light transmission characteristics of the electro-absorption modulator.

11. The electro-absorption modulator of claim 10 further comprising a thermal sensor that is in thermal communication with at least one of the semiconductor layer of the electro-absorption modulator and a laser that generates the light.

12. The electro-absorption modulator of claim 11 further comprising a temperature-driven controller having an input that is electrically coupled to the thermal sensor and an output that is electrically coupled to a DC bias voltage control input of the electronic data modulator, the temperature-driven controller generating a signal that causes the electronic data modulator to change a DC bias voltage of the AC electrical modulation signal.

13. The electro-absorption modulator of claim 12 wherein the temperature-driven controller includes a processor that uses a look-up table to determine the DC bias voltage.

14. An electro-absorption modulated laser comprising;
a) a laser that generates light at an output; and
b) an electro-absorption modulator comprising a semiconductor layer that is optically coupled to the output of the laser, the semiconductor layer having an electrically controllable absorption, a material composition of the semiconductor layer being chosen so that a transmission response of the modulator as a function of applied voltage shifts with an increasing operating temperature of the modulator so that the semiconductor layer is substantially transparent to light propagating through the semiconductor layer when a substantially zero or a reverse bias voltage is applied across the semiconductor layer at operating temperatures of the electro-absorption modulator that are substantially greater than 25 degrees Celsius.

15. The electro-absorption modulated laser of claim 14 wherein the semiconductor layer of the electro-absorption modulator comprises a multi-quantum well layer.

16. The electro-absorption modulated laser of claim 14 wherein the laser comprises a distributed feedback semiconductor laser.

17. The electro-absorption modulated laser of claim 14 wherein the laser and the electro-absorption modulator are integrated onto a single substrate.

18. The electro-absorption modulated laser of claim 14 wherein the laser and the electro-absorption modulator are physically separate devices that are optically coupled.

19. The electro-absorption modulated laser of claim 14 further comprising a thermoelectric cooler that is in thermal communication with the laser.

20. The electro-absorption modulated laser of claim 19 wherein the thermoelectric cooler adjusts the temperature of the laser to change a wavelength of the light generated by the laser.

21. The electro-absorption modulated laser of claim 14 wherein a wavelength of the light generated by the laser is substantially 1310 nm.

22. The electro-absorption modulated laser of claim 14 wherein a wavelength of the light generated by the laser is substantially 1550 nm.

23. The electro-absorption modulated laser of claim 14 wherein a voltage sensitivity with respect to wavelength of the electro-absorption modulator is substantially the same as a voltage sensitivity with respect to wavelength or the laser.

24. The electra-absorption modulated laser of claim 14 wherein the material composition of the semiconductor layer of the electro-absorption modulator is chosen so that the transmission response of the modulator as a function of applied voltage shifts with an increasing operating temperature of the modulator so that the semiconductor layer is substantially transparent to light propagating through the semiconductor layer when a substantially zero or a reverse bias voltage is applied across the semiconductor layer at operating temperatures of the electro-absorption modulator that are substantially greater than 35 degrees Celsius.

25. A transmitter for an optical communication system, the transmitter comprising:
a) a laser that generates light at an output;
b) an electro-absorption modulator having an electrically controllable absorption, the electro-absorption modulator comprising a semiconductor layer that is optically coupled to the output of the laser, a material composition of the semiconductor layer being chosen so that a transmission response of the modulator as a function of applied voltage shifts with an increasing operating temperature of the modulator so that the semiconductor layer is substantially transparent to light propagating through the semiconductor layer when a substantially zero or a reverse bias voltage is applied across the semiconductor layer at operating temperatures of the electro-absorption modulator that are substantially greater than 25 degrees Celsius;
c) an electronic data modulator having an output that is electrically coupled to a modulation input of the electro-absorption modulator, the electronic data modulator generating an AC electrical modulation signal having a peak-to-peak voltage amplitude that changes an absorption edge of the semiconductor layer, thereby changing light transmission characteristics of the electro-absorption modulator and modulating the light generated by the laser;
d) a thermal sensor that is in thermal communication with at least one of the semiconductor layers of the electro-absorption modulator and the laser; and
e) a temperature-driven controller having an input that is electrically coupled to the thermal sensor and an output that is electrically coupled to a DC bias control input of the electronic data modulator, the temperature-driven controller generating a signal that causes the electronic data modulator to change a DC bias voltage of the AC electrical modulation signal.

26. The transmitter of claim 25 wherein a wavelength of the light generated by the laser is substantially 1310 nm.

27. The transmitter of claim 25 wherein a wavelength of the light generated by the laser is substantially 1550 nm wavelength.

28. The transmitter of claim 25 wherein a voltage sensitivity with respect to wavelength of the electro-absorption modulator is substantially the same as a voltage sensitivity with respect to wavelength of the laser.

29. The transmitter of claim 25 wherein the material composition of the semiconductor layer of the electro-absorption modulator is chosen so that a transmission response of the modulator as a function of applied voltage shifts with an increasing operating temperature of the modulator so that the semiconductor layer is substantially transparent to light propagating through the semiconductor layer when a substantially zero or a reverse bias voltage is applied across the semiconductor layer at operating temperatures of the electra-absorption modulator that are substantially greater than 45 degrees Celsius.

30. A method of modulating light, the method comprising:
   a) applying a DC reverse bias voltage across a semiconductor layer having an electrically controllable absorption;
   b) propagating light through a semiconductor layer having an electrically controllable absorption, a transmission response of the semiconductor layer as a function of applied voltage shifting with an increasing operating temperature of the semiconductor layer so that the semiconductor layer is substantially transparent to light propagating through the semiconductor layer when a substantially zero or a reverse bias voltage is applied across the semiconductor layer at operating temperatures of the electra-absorption modulator that are substantially greater than 25 degrees Celsius; and
   c) applying an AC electrical modulation signal having a peak-to-peak voltage amplitude across the semiconductor layer, the modulation signal changing an absorption edge of the semiconductor layer, thereby modulating the light.

31. The method of claim 30 further comprising:
   a) measuring a temperature of at least one of the semiconductor layers and a laser that generates the light; and
   b) changing the DC reverse bias voltage across the semiconductor layer in response to the measured temperature.

32. The method of claim 30 further comprising:
   a) measuring a temperature of at least one of the semiconductor layers and a laser that generates the light; and
   b) changing a bias current driving a laser that generates the light in response to the measured temperature.

33. A method of tracking a temperature of an electro-absorption modulator to a temperature of a semiconductor laser, the method comprising:
   a) generating light with a semiconductor laser;
   b) propagating the light through an electro-absorption modulator comprising a semiconductor layer having an electrically controllable absorption, a material composition of the semiconductor layer being chosen so that a transmission response of the modulator as a function of applied voltage shifts with an increasing operating temperature of the modulator so that the semiconductor layer is substantially transparent to light propagating through the semiconductor layer when a substantially zero or a reverse bias voltage is applied across the semiconductor layer at operating temperatures of the electro-absorption modulator that are substantially greater than 25 degrees Celsius;
   c) applying an AC electrical modulation signal having a DC reverse bias voltage and a peak-to-peak voltage amplitude across the semiconductor layer, the modulation signal changing an absorption edge of the semiconductor layer, thereby changing light transmission characteristics of the electro-absorption modulator and modulating the light generated by the laser;
   d) measuring a temperature or the semiconductor laser that generates the light; and
   e) changing at least one of the DC reverse bias voltage and the peak-to-peak voltage amplitude of the AC electrical modulation signal, and a bias current through the laser in response to the measured temperature.

* * * * *

UNITED STATES PATENT AND TRADEMARK OFFICE
CERTIFICATE OF CORRECTION

| | |
|---|---|
| PATENT NO. | : 7,120,183 B2 |
| APPLICATION NO. | : 10/005065 |
| DATED | : October 10, 2006 |
| INVENTOR(S) | : Krasulick et al. |

It is certified that error appears in the above-identified patent and that said Letters Patent is hereby corrected as shown below:

Col. 33, line 36 should read as follows:
Replace "temperature or the semiconductor" with --temperature of the semicondutor--

Signed and Sealed this

Twenty-sixth Day of December, 2006

JON W. DUDAS
*Director of the United States Patent and Trademark Office*